(12) United States Patent
Toros et al.

(10) Patent No.: US 7,464,295 B2
(45) Date of Patent: Dec. 9, 2008

(54) SOFTWARE PROGRAMMABLE VERIFICATION TOOL HAVING MULTIPLE BUILT-IN SELF-TEST (BIST) MODULES FOR TESTING AND DEBUGGING MULTIPLE DEVICES UNDER TEST (DUT)

(75) Inventors: Zevnep M. Toros, Irvine, CA (US); Esin Terzioglu, Aliso Viejo, CA (US); Gil Winograd, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 899 days.

(21) Appl. No.: 10/269,635

(22) Filed: Oct. 11, 2002

(65) Prior Publication Data

US 2004/0073840 A1  Apr. 15, 2004

(51) Int. Cl.
*G06F 11/00* (2006.01)
(52) U.S. Cl. .......................................... 714/30; 714/31
(58) Field of Classification Search .................... 714/30, 714/31
See application file for complete search history.

(56) References Cited

U.S. PATENT DOCUMENTS

| | | | |
|---|---|---|---|
| 5,138,619 A | | 8/1992 | Fassang et al. |
| 5,862,151 A | | 1/1999 | Fagerness |
| 5,991,898 A | * | 11/1999 | Rajski et al. ................... 714/30 |
| 6,249,893 B1 | | 6/2001 | Rajsuman et al. |
| 6,321,320 B1 | * | 11/2001 | Fleischman et al. ......... 711/217 |
| 6,360,342 B1 | | 3/2002 | Lee et al. |
| 6,374,370 B1 | | 4/2002 | Bockhaus et al. |
| 6,918,057 B1 | * | 7/2005 | Brophy et al. ................. 714/30 |
| 2002/0019926 A1 | * | 2/2002 | Huppenthal et al. ........... 712/15 |
| 2002/0123854 A1 | | 9/2002 | Engel et al. |

OTHER PUBLICATIONS

European Search Report corresponding to European Patent Application No. 03022916.5-2224, mailed May 13, 2008, 3 pages.

* cited by examiner

*Primary Examiner*—Michael C Maskulinski
(74) *Attorney, Agent, or Firm*—McAndrews, Held & Malloy, Ltd.

(57) ABSTRACT

Aspects of the invention may include testing and debugging an embedded device under test. Testing and debugging and embedded device under test may include the step of loading an instruction into a parameterized shift register of each one of a plurality of BIST modules coupled to an individual one of a plurality of embedded memory modules comprising the embedded device under test. An identity of each of the instruction loaded into the parameterized shift register of each one of the plurality of BIST modules may subsequently be determined. A separate test signal may be generated from each one of the plurality of BIST modules corresponding to the determined identity of the instruction loaded in each one of the plurality of BIST modules, each one of the generated test signals causing control and execution of the testing and debugging of a corresponding one of each of the plurality of embedded memory modules comprising the embedded device under test.

33 Claims, 7 Drawing Sheets

SOFTWARE PROGRAMMABLE VERIFICATION TOOL HAVING MULTIPLE BUILT-IN SELF-TEST (BIST) MODULES FOR TESTING AND DEBUGGING MULTIPLE DEVICES UNDER TEST (DUT)

CROSS-REFERENCE TO RELATED APPLICATIONS/INCORPORATION BY REFERENCE

Not applicable.

BACKGROUND OF THE INVENTION

Certain embodiments of the invention relate to the testing of embedded devices. More specifically, certain embodiments relate to a software programmable verification tool having a built-in self-test (BIST) for testing and debugging multiple memory modules in an embedded device under test (DUT).

Advancement in chip technology has resulted in the development of embedded processors and controllers. Embedded processors and/or controllers may include microprocessor and/or microcontroller circuitry that have been integrated into a single package containing associated companion logic and peripherals. Embedded processors differ from microprocessors and microcontrollers in that microprocessors and microcontrollers are typically coupled with associated logic on a circuit board to implement a specified application.

Further advancements in chip technology have increased packaging density to the point where it is now possible to implement a standalone application on a single chip. In this regard, the resulting integrated circuit (IC) is called a system on a chip (SoC). A SoC may include one or more microprocessor and/or microcontroller elements, peripherals, associated logic and memory all fabricated on a densely packaged IC. For example, a SoC for a broadband set-top box may include a receiver, a transmitter, a digital signal processor, one or more encoders and decoders, random access memory (RAM), and non-volatile memory (NVM), all of which may be integrated on a single chip. The peripherals are typically called embedded peripherals. In the case of a memory element, the memory element may be called an embedded memory.

Notwithstanding, these advancements in chip technology are not without their challenges. Chip testing is crucial to design, development, manufacture and integration phases. Chip density, has and in some cases, almost eliminated the use of traditional chip testing methods. For example, many embedded systems utilize multiple layers of epoxy having conduits and lines buried deep within, making them practically inaccessible to external debugging and verification tools. Additionally, traditional methods such as capturing traces using an oscilloscope may be problematic for many embedded processors that either operate at or have bus speeds in excess of a few hundred megahertz (MHz).

Although techniques such as boundary-scan have been developed to address some of these problems, boundary scan may not be a practical solution in embedded systems, for example embedded memories, where real estate is extremely expensive and in which embedded system components are densely packed. Boundary-scan typically includes embedding at least one test access port (TAP) and associated circuitry into an embedded system to facilitate tasks such as testing debugging, and verification. For example, the Institute of Electronic Engineers (IEEE) joint test action group (JTAG) TAP or IEEE 1149.1 standard utilizes boundary-scan for debugging and verifying embedded systems.

Furthermore, as the cost of memory continues to decline, increased packaging density technology has resulted a proliferation of embedded systems with large amounts of memory. Especially in cases where there is no direct connection between embedded memory module pins and the package pins, external testing may be extremely difficult if not impossible. Attempts to use complex and often convoluted test vectors are extremely time consuming and typically result in increased chip cost.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention facilitate testing and debugging an embedded device under test. A method for testing and debugging and embedded device under test may include the step of loading an instruction into a parameterized shift register of each one of a BIST module coupled to an individual one of a plurality of embedded memory modules comprising the embedded device under test. An identity of each of the instruction loaded into the parameterized shift register of each one of the BIST modules may subsequently be determined. A separate test signal may be generated from each one of the BIST modules corresponding to the determined identity of the instruction loaded in each one of the BIST modules, each one of the generated test signals causing control and execution of the testing and debugging of a corresponding one of each of the plurality of embedded memory modules comprising the embedded device under test.

The loading may further include the step of generating at least one clock signal from a host application software. The at least one clock signal may be adapted to control the loading of the instruction into the parameterized shift register of each one of the a BIST modules. The loading step may further include shifting the instruction into the parameterized shift register of each one of the BIST modules. A command within the instruction shifted into each one of the parameterized shift register of each one of the BIST modules may subsequently be identified. The identifying step may further include decoding the identified command for each one of the BIST modules.

Test results may subsequently be loaded from each one of the plurality of embedded memory modules into the parameterized shift register of the BIST modules coupled to the individual one of the plurality of embedded memory modules. The loaded test results may be shifted out of each one of the parameterized shift register under control of a host application software. The host application software may be adapted to control each one of the BIST modules which are coupled to an individual one of the plurality of embedded memory modules.

At least a portion of the test results for each one of the memory modules coupled to each one of the BIST modules may be stored in an internal register accessible by the host application software. The identity of each of the instructions loaded into the parameterized shift register of each one of the BIST modules may be different or they may be the same. The generation of separate test signals from each one of the BIST modules corresponding to the determined identity of the instruction loaded in each one of the BIST modules, may cause a serial or parallel execution of the testing and debugging of the plurality of embedded memory modules comprising the embedded device under test.

Another embodiment of the invention also provides system for testing and debugging an embedded device under test. The system may include at least one loader adapted to load an instruction into a parameterized shift register of each one of a BIST module coupled to an individual one of a plurality of embedded memory. At least one identifier may be adapted to determine an identity of each of the instruction loaded into the parameterized shift register of each one of the BIST modules. At least one generator may be adapted to generate a separate test signal from each one of the BIST modules corresponding to the determined identity of the instruction loaded in each one of the BIST modules. Each one of the generated test signals may be configured to cause control and execution of the testing and debugging of a corresponding one of each of the plurality of embedded memory modules comprising the embedded device under test.

At least one generator may be adapted to generate at least one clock signal from a host application software, the at least one clock signal controlling the loading of the instruction into the parameterized shift register of each one of the BIST modules. The at least one loader may further include at least one shifter adapted to shift the instruction into the parameterized shift register of each one of the BIST modules. The at least one identifier may be adapted to identify a command within the instruction shifted into each one of the parameterized shift register of each one of the BIST modules. The at least one identifier may include at least one decoder adapted to decode the identified command for each one of the BIST modules. The at least one loader may be adapted to load test results from each one of the plurality of embedded memory modules into the parameterized shift register of the BIST modules coupled to the individual one of the plurality of embedded memory modules. The at least one shifter may be adapted to shift the loaded test results out of each one of the parameterized shift register under control of a host application software. The host application software may be adapted to control each one of the BIST modules coupled to an individual one of the plurality of embedded memory modules.

At least one internal register may be provided for storing at least a portion of the test results for each one of the memory modules within each one of the BIST modules. The internal register may be configured so that it is accessible by the host application software. The identity of each of the instruction loaded into the parameterized shift register of each one of the BIST modules may be the same or they may be different. The at least one generator adapted to generate the separate test signal from each one of the BIST modules corresponding to the determined identity of the instruction loaded in each one of the BIST modules, may be adapted to cause either a parallel or serial execution of the testing and debugging of a the plurality of embedded memory modules comprising the embedded device under test.

In another embodiment of the invention, a machine-readable storage, having stored thereon a computer program having a plurality of code sections for testing and debugging an embedded device under test, the code sections executable by a machine for causing the machine to perform the steps as described above, is provided.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 2b is a block diagram of an exemplary arrangement of a plurality of BIST modules each of which is coupled to a single memory module in accordance with the embodiment of FIG. 2a.

DETAILED DESCRIPTION OF THE INVENTION

Aspects of the invention provide a software programmable verification tool having a built-in self-test (BIST) module for testing and debugging multiple memory modules in an embedded device under test (DUT). The invention provides a software programmable BIST that may be capable of testing, for example, embedded single-port or dual-port embedded on-chip memories at any speed up to a maximum tolerated speed for the memory device. Advantageously, the software programmable BIST, may remove some design complexities from a device level to a software level. Software programmability also enables flexible test pattern generation during testing and consequently improves fault coverage of the BIST. Accordingly, since the BIST enables software programmability, it provides a flexible platform for system development and integration.

Figure 1A:
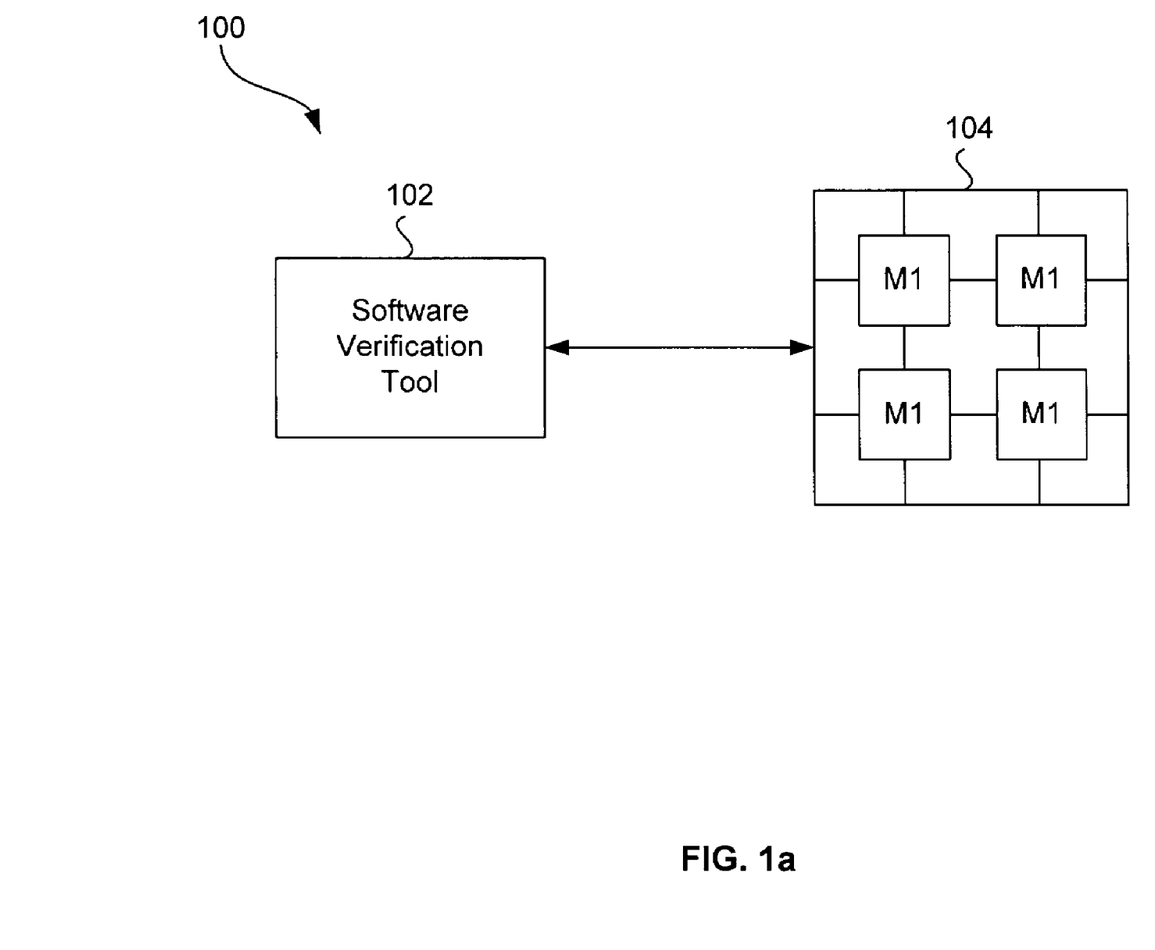
FIG. 1a is a high-level block diagram of a software programmable verification tool in accordance with an embodiment of the invention.

FIG. 1a is a high-level block diagram 100 of a software programmable verification tool in accordance with an embodiment of the invention. Referring to FIG. 1a, there is shown a software programmable verification tool 102 and an embedded memory 104. In one embodiment of the invention, the software programmable verification tool 102 may be remotely located from the embedded memory 104. In another embodiment of the invention, the software programmable verification tool 102 may be collated with the embedded memory 104 in a common embedded system such as a core.

Figure 1B:
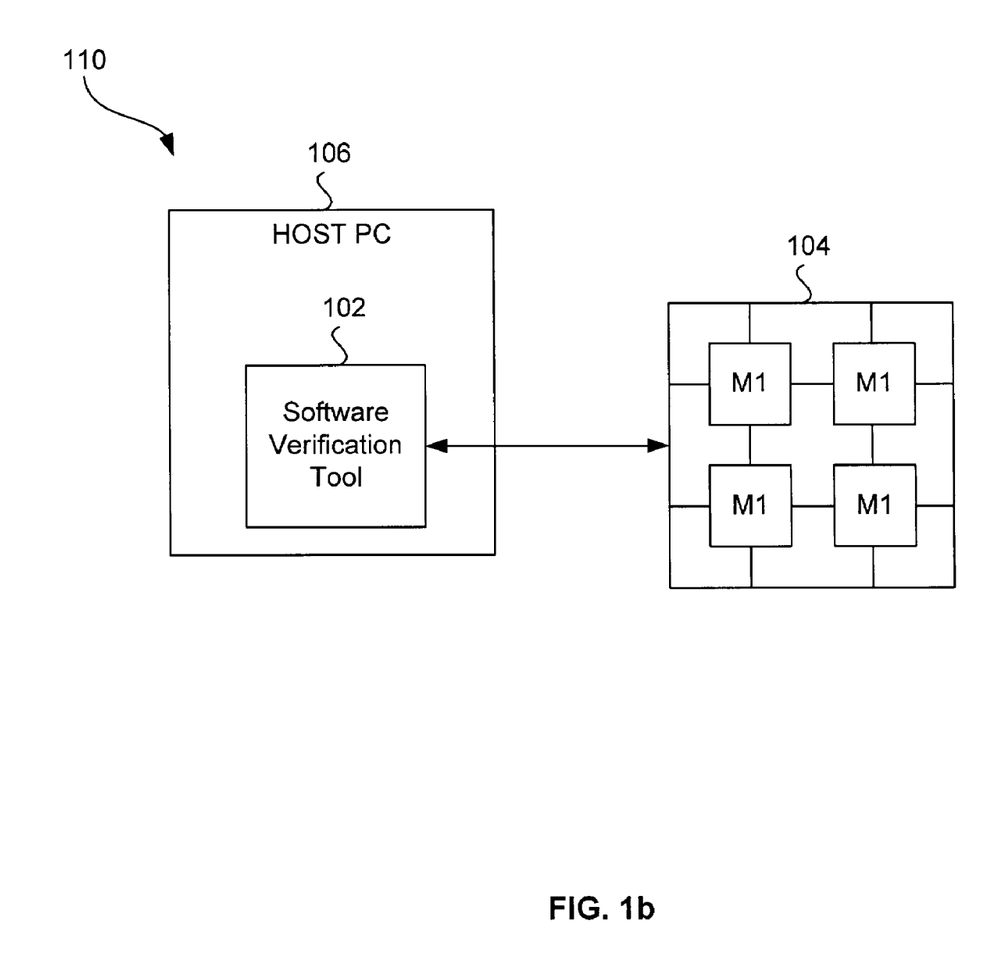
FIG. 1b is a high-level block diagram illustrating the software programmable verification tool of FIG. 1a located remotely from the embedded memory.

FIG. 1b is a high-level block diagram 110 illustrating the software programmable verification tool 102 of FIG. 1a located remotely from the embedded memory 104. Referring to FIG. 1b, the software programmable verification tool 102 may be part of a host system or a test fixture. For example, the host system may be a personal computer (PC) 106 or an embedded system tool (EST). In this regard, the host PC 106 may be configured as a host processor for the software programmable verification tool 102. The PC 106 may be coupled to the embedded memory 104 via, for example, a connector or socket adapted to communicate suitable signals, for example, clock, address, data and control signals, between the software programmable verification tool 102 and the embedded memory 102.

Figure 1C:
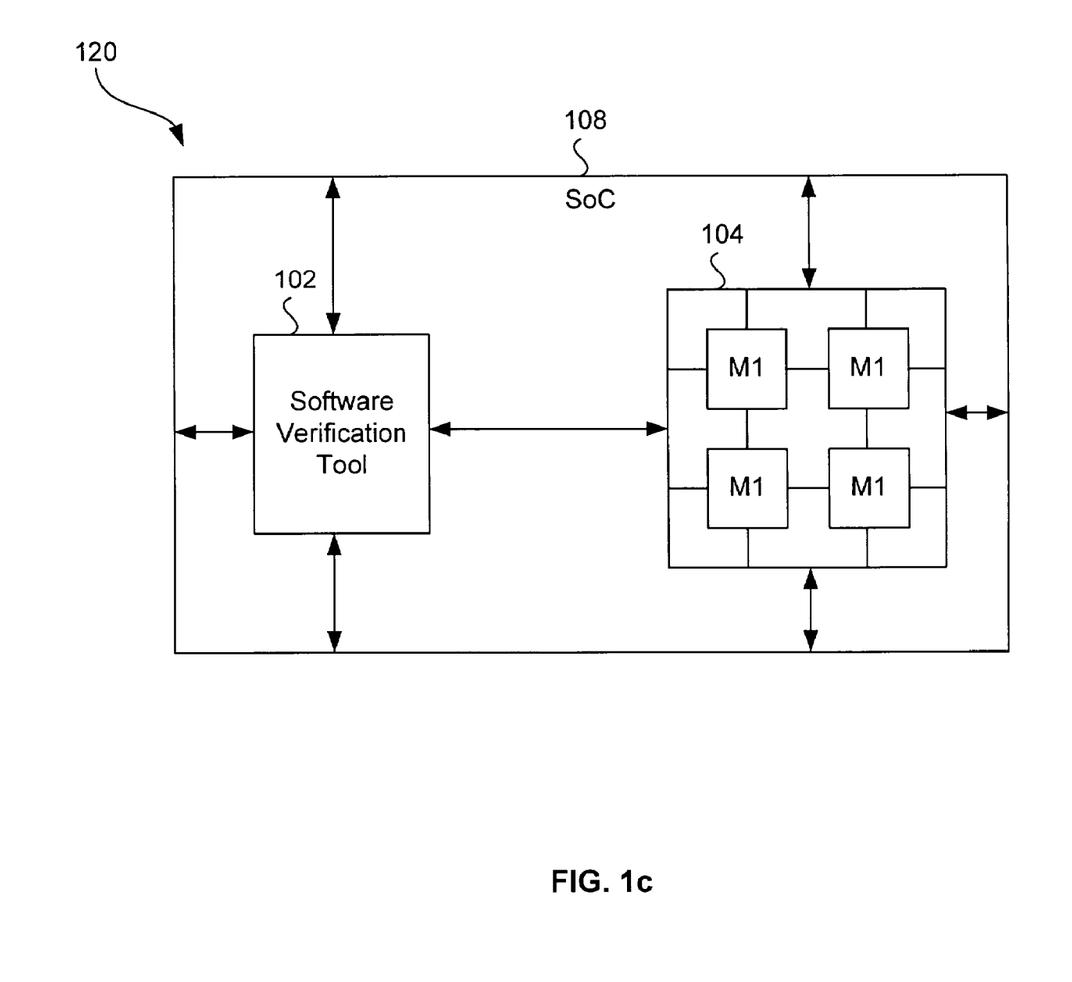
FIG. 1c is a high-level block diagram illustrating the software programmable verification tool of FIG. 1 co-located with the embedded memory.

FIG. 1*c* is a high-level block diagram 120 illustrating the software programmable verification tool 102 of FIG. 1 co-located with the embedded memory 104. Referring to FIG. 1*a*, the software programmable verification tool 102 may be part of an embedded system such as a SoC 108. In this regard, the software programmable verification tool may be arranged so that it is embedded within the fabric or core of the SoC 108. In this arrangement, the signals such as clock, address, data and control of the software programmable verification tool 102 may be coupled directly to the embedded memory 104 on chip. Various external pins on the SoC 108 may be adapted to provide certain signals off-chip.

Figure 2A:
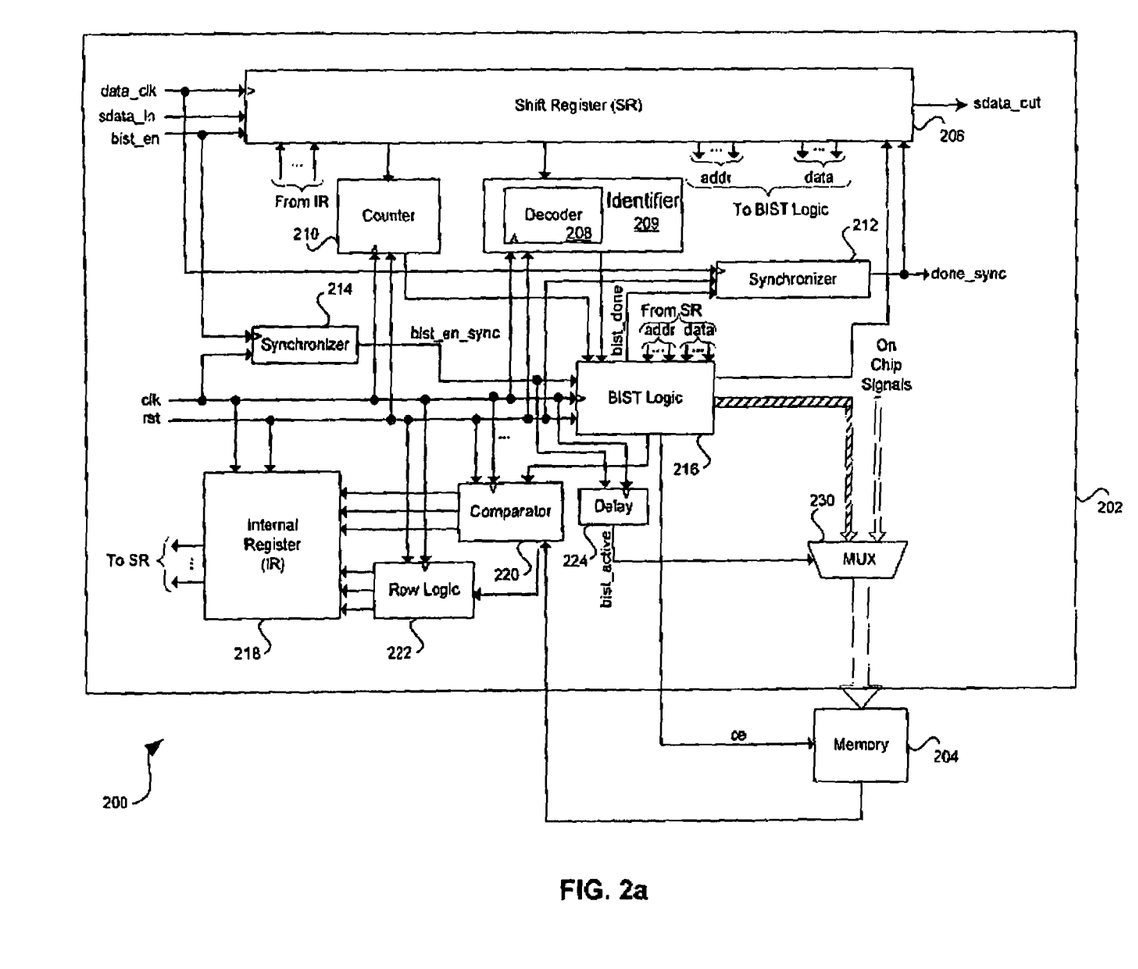
FIG. 2a is a block diagram of an exemplary arrangement of a BIST module BIST module coupled to a single memory module in accordance with an embodiment of the invention.

In accordance with an embodiment of the invention, the various embodiments of the software verification tool in FIG. 1*b* and FIG. 1*c* may include a built-in self-test (BIST) module. FIG. 2*a* is a block diagram of an exemplary BIST module 202 coupled to a memory 204 in accordance with an embodiment of the invention. Referring to FIG. 2*a*, the BIST module 202 may include a shift register 206, a decoder 208, an identifier 209, a counter 210, a first synchronizer 212, a second synchronizer 214, a BIST logic block 216, an internal register 218, a comparator 220, a row logic block 222, a delay block 224, and a multiplexer (MUX) 230. The BIST module 202 may be adapted to test and debug, for example, custom single or dual port static memories at operational speed or at speeds lower than operational speed. Advantageously, a plurality of BIST modules such as BIST module 202 may each be adapted to test and debug a single one of a plurality of memories sequentially or in parallel. Sequential testing methodology may provide reduced on-chip area for fabrication, while parallel testing methodology may provide reduced test time.

The shift register 206 in BIST module 202 may be a sequential register that may be adapted to receive serially shifted test commands and/or data. Various portions of the shift register 206 may be coupled to counter 210, decoder 208 and the BIST logic block. An input signal (sdata_in) containing an instruction having a test command and/or associated data may be serially shifted into the shift register 206. An output signal (sdata_out) may be provided to shift data out of the shift register 206. A BIST enable signal (bist_en) and a data clock signal (data_clk) may control certain operations of the shift register 206, for example the shifting of data into and out of the shift register 206.

The decoder 208 may be coupled to the shift register 206. Accordingly, the decoder 208 may be configured to receive at least a portion of the sdata_in signal and decode at least a portion of the received sdata_in signal that may be serially shifted into the shift register 206. The portion of the serial data that the decoder 208 may receive may contain at least one command or instruction to be executed by the BIST module 202.

The BIST logic block 216 may be coupled to at least the decoder 208 and the counter 210. Additional inputs to the BIST logic block 216 may include, but are not limited to a system clock signal (clk) and a reset signal (rst). The system clock signal (clk) may be provided by a host system application and may be adapted to control various functions of the BIST module 202. The reset signal (rst) may also be provided from the host system application and may be adapted to reset various components of the BIST module 202 to a known state. The BIST logic block 216 may contain suitable circuitry and logic that may be configured to generate signals such as data, address, control, and timing signals. For example, BIST logic block 216 may be configured to generate a done signal, which may serve as an input to the first synchronizer 212. The BIST logic block 216 may also be configured to produce an output signal that may be provided as an input to the comparator 220.

The counter 210 may be coupled to the shift register 206 and may be adapted to monitor the commands being shifted into the shift register 206. In this regard, the counter 210 may count the number of consecutive executions of a command during a single test period. An output signal generated by the counter 210 may be provided as an input to the BIST logic block 210. Additional inputs to the counter 210 may include, but are not limited to, a system clock signal (clk) and a reset signal (rst). The system clock signal (clk) and the reset signal (rst) may be provided by the host system application and may be adapted to reset counter 210 to a known state.

The first synchronizer 212 may be configured to synchronize the bist_done signal (bist_done) from the system clock to the data clock signal (data_clk). The data clock signal (data_clk) may be adapted as an input to the shift register 206 and the bist_done signal may be generated by the BIST logic block 210. The BIST logic block 210 may be configured to generate the bist_done signal, for example, at the end of completion of a specified test and/or operation. The synchronized output signal generated by the synchronizer 212 may include a done_sync signal. In one embodiment of the invention, upon synchronization of the done_sync signal, whenever the done_synch is set to a logic one (1) or goes high, the shift register 206 may be overwritten with at least a portion of the contents of the internal register 218. In this regard, data results for any test may be loaded from the internal register 218 into the shift register 206. The result data may subsequently be shifted out of the shift register 206 whenever the bist_en signal is set to a logic zero (0) or pulled low.

The second synchronizer 214 may be configured to synchronize the system clock signal (clk) and the bist_en signal, which may be an input to the shift register 206. A resulting synchronized signal bist_en_sync may be provided as an input to the BIST logic block 216. The delay block 224 may be configured to introduce a delay in the bist_en_sync signal, thereby generating a bist_active signal. The bist_active signal may be coupled as an input select to the MUX 230.

At least a portion of the I/O pins of the shift register may be coupled to the BIST logic block 216. For example, portions of the shift register 206 that may correspond to one or more addresses and/or one or more data may be coupled to corresponding address and data inputs of the BIST logic block 216. To support the stop on error mode of operation, a stop-on-error signal may be coupled to the BIST logic block 216. The BIST logic block 216 may be adapted to generate various data and control signals, some of which may be coupled to the MUX 230 as data input and/or select signals. Exemplary control signals generated by the BIST logic block 216 may include, but are not limited to, address, data, write enable (we), chip enable (ce), bist (bi) and sub-word writeable (sw) signals. In one aspect of the invention, the BIST module 202 may be configured so that the write enable (we), chip enable (ce), and software enable (sw) signals are active low signals, although the invention is not limited in the regard. One or more of the signals generated by the BIST logic block 216 may control operations, such as, enabling the MUX 230 to select memory module 204 to be tested. The testing may include writing to and reading from memory module 204. The chip enable (ce) signal generated by the BIST logic block 216 may be adapted to control the reading and writing of data to and from memory module 204.

The comparator 220 may be coupled to the BIST logic block 216 via an expected data signal (expected_data). Comparator 220 may also be coupled to an output of memory 204 to receive the RAM data output signal (rdata_o) from memory 204. The comparator 220 may be adapted to include suitable circuitry and/or logic that may compare the expected data output signal (expected_data) received from the BIST logic block 216 with corresponding RAM output data signal (rdata_o) signal from memory 204.

The comparator 220 may generate various output signals that may indicate a status and/or information pertaining to a test. For example, the comparator 220 may generate a RAM data out (rdata_o) signal to indicate the actual data read from a location in memory, an expected data signal (expected_data) which may indicate the data that was written to the memory, and an error_address signal indicating an address of a location in memory where an error occurred. The rdata_o signal, the expected_data signal and the error_address signals may be communicated to the internal register 218 where they may set one or more bits in specified memory locations and/or registers.

A row logic block 222 may be adapted to execute various row-redundancy algorithms based on data received from the comparator 220. An output error signal from comparator 220 may be coupled to an input of a row logic block 222. In one embodiment of the invention, the row logic block 222 may be adapted to generate one or more of a failing address location n signal (fail_loc_n), a failing column signal (fail_col), and a pass/fail signal (pass_fail). The fail_loc_n signal, the fail_col signal and the pass_fail signals may be communicated to the internal register 218 where they may set one or more bits in specified memory locations and/or registers.

In another aspect of the invention, the comparator 220 may be adapted to generate a col_fail signal that may be utilized to indicate the results of testing various columns of the memory module under test. In this regard, the comparator 220 may be configured to generate a rdata_o signal and an expected_data signal. The rdata_o signal may represent results read from one or more memory locations and the expected_data signal may represent corresponding results that were expected from the one or more memory location that were tested. The rdata_o and the expected_data signals and be adapted to set one or more corresponding rdata_o and/or expected_data bits in the internal register 218. Accordingly, one or more bits representing each of the rdata_o bits and the expected data bits may be accumulated and an XOR operation executed on a the accumulated rdata_o and expected_data bits. The col_fail signal may represent the cumulative results of the XOR operation on a column-by-column basis for the accumulated rdata_o and expected_data bits. Logic one (1) at the end of testing a column may represent a column failure.

Figure 2B:
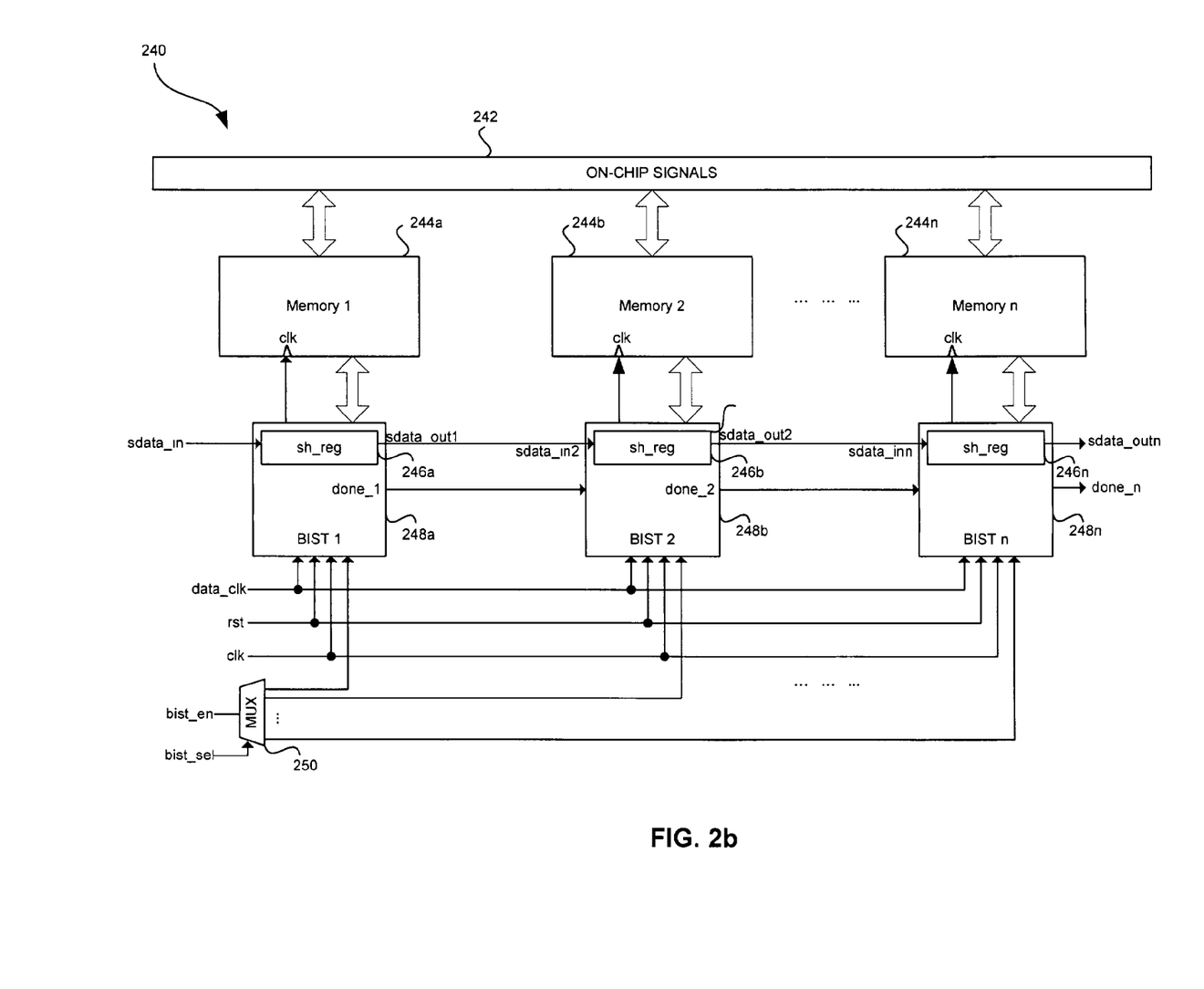

FIG. 2b is a block diagram 240 of an exemplary arrangement of a plurality of BIST modules each of which is coupled to a single memory module in accordance with the embodiment of FIG. 2a. Referring to FIG. 2b, there is shown BIST modules 248a, 248b, . . . , 248n, shift register 246a, 246b, . . . , 246n, memory modules 244a, 244b, . . . , 244n, an on-chip signal block 242, a MUX 250 and various signals. Each of the BIST modules 248a, 248b, . . . , 248n may have a corresponding shift register 246a, 246b, . . . , 246n. Each of the BIST modules 248a, 248b, . . . , 248n may be coupled to one of the memory modules 248a, 248b, . . . , 248n, respectively. The shift register 246a, 246b, . . . , 246n of each of the BIST modules 248a, 248b, . . . , 248n may be serially coupled. In this regard, an output of shift register 246a, namely sdata_out1, may be coupled to an input of shift register 246b, namely sdata_in1. An output of shift register 246b, namely sdata_out2, may be coupled to an input of shift register 246c (not shown), namely sdata_in3 (not shown). Finally, an output of shift register 246(n-1), namely sdata_out(n-1) may be coupled to an input of shift register 246n, namely sdata_inn. The output signal of the shift register 246n is sdata_outn. A BIST enable signal (bist_en) and a BIST select (bist_sel) may be coupled to MUX 250 to select which BIST module may be active.

In block diagram 240, each of the BIST modules 248a, 248b, . . . , 248n, may be adaptively coupled to a single one of the memory modules 244a, 244b, . . . , 244n. Accordingly, each BIST may independently test the memory module to which it is coupled. In this regard, the memory modules may be tested in a serial manner or in parallel. Advantageously, different types of test may be run on each of the memory modules since each memory module may have a dedicated BIST module coupled thereto. In this regard, the shift registers of each of the BIST modules 244a, 244b, . . . , 244n may be loaded with a different instruction to execute a different memory test.

In operation, data may be serially shifted into shift register 246 of BIST module 1 using the data clock (data_clk) and/or system clock (clk) signal. Accordingly, the BIST enable signal (bist_en) and a BSIT select signal (bist_sel) may be adapted to control which BIST is enabled and consequently how data may be shifted in and out of the various shift registers 246a, 246b, . . . , 246n. In accordance with one aspect of the invention, the MUX 250 may select BIST 1 and a test may be executed on memory module 1. In another embodiment of the invention, MUX 250 may enable BIST modules BIST 2 through BIST n, thereby permitting corresponding memory modules memory 2 through memory n to be tested. In general, the MUX 250 may enable any one or more the BIST modules 248a, 248b, . . . , 248n, and/or disable any one or more of the BIST modules 248a, 248b, . . . , 248n during testing. Accordingly, any one or more of the memory modules coupled to an active or enabled BIST module may be tested.

Figure 3:
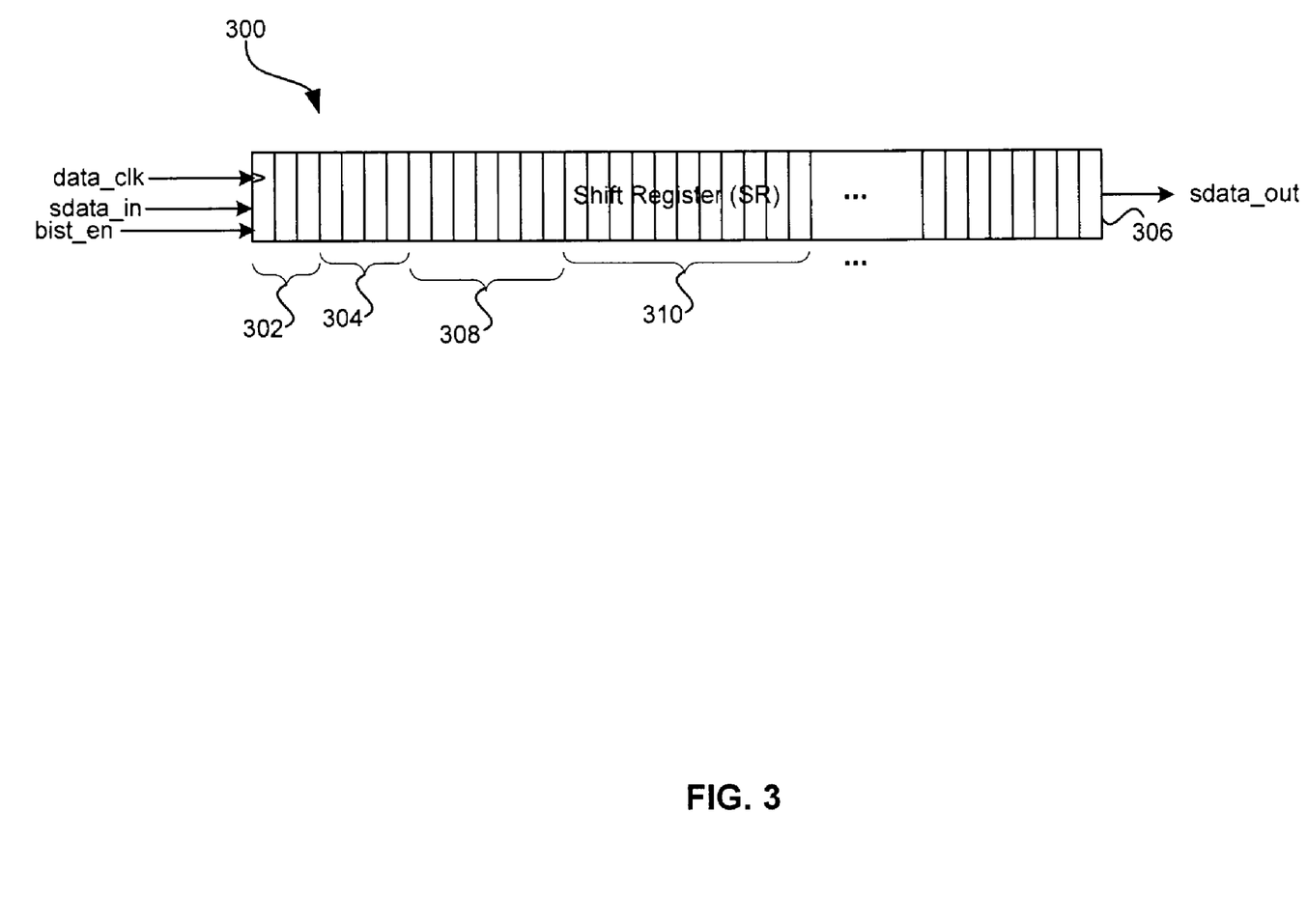
FIG. 3 is a block diagram illustrating an exemplary parameterization for an input to the shift register of the BIST module of FIG. 2 in accordance with an embodiment of the invention.

FIG. 3 is a block diagram 300 illustrating an exemplary parameterization for an input to the shift register 206 of the BIST module of FIG. 2 in accordance with an embodiment of the invention. Referring to FIG. 3, the shift register 306 may be arranged so that a first portion 302 of the shift register 306 may contain a command to be executed by the BIST module 202 (FIG. 2). In one embodiment of the invention, the first portion 302 of the shift register 306 may contain a total of 3 bits, thereby providing $2^3$ or eight (8) possible commands that may be decoded by the decoder 208 (FIG. 2) and provided to the BIST logic block 216 for processing. A second portion 304 of the shift register 306 immediately successive to the first portion 302 may contain a counter value that may be utilized by the counter 210 (FIG. 2). The second portion 304 of the shift register 306 may contain a total of 4 bits, thereby providing $2^4$ or sixteen (16) possible count values that may be utilized by the counter 210.

A third portion 308 of the shift register 306 immediately successive to the second portion 304 may contain a first address value that may be decoded by decoder 208 and provided to the BIST logic block 216 for processing. The third portion 308 of the shift register 306 may contain a total of m bits, thereby providing the possibility of addressing $2^m$ memory locations of the memory 204. A fourth portion 310 of the shift register 306 immediately successive to the third portion 308 may contain a first data value that may be decoded by decoder 208 and provided to the BIST logic block 216 for processing. The fourth portion 310 of the shift register 306 may contain a total of n bits, thereby providing the possibility of writing or reading a $2^n$-bits wide word to a location of the memory 204.

The bit size of the command, counter, first address and second address are for illustrative purposes and the invention is not limited in this regard. Additionally, the exact positioning of the command, counter, first address and second address may be altered without departing from the spirit of the invention. In this regard, the command could be followed by the first data, followed by the counter, which may be followed by the first address. Furthermore, there may be more than one address fields, for example a second address, a third address, a fourth address and so on. Similarly, there may be more than one data fields, for example a second data, a third data, a fourth data and so on.

Figure 4:
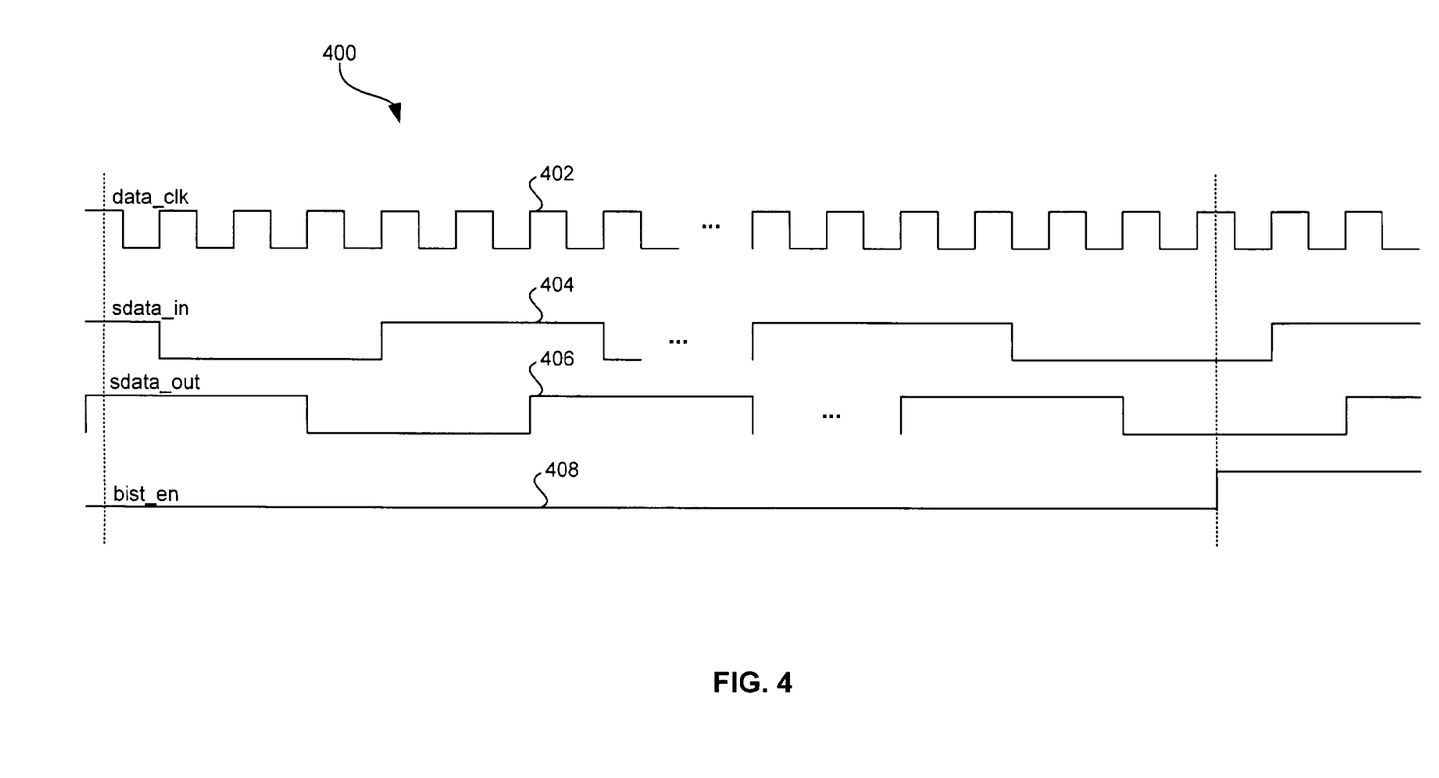
FIG. 4 is an exemplary timing diagram that may be utilized to shift data in and out of the shift register of the BIST module of FIG. 2 in accordance with an embodiment of the invention.

FIG. 4 is an exemplary timing diagram 400 that may be utilized to shift data in and out of the shift register 206 of the BIST module 202 of FIG. 2 in accordance with an embodiment of the invention. Referring to FIG. 4, there is shown clock signals for a data clock (data_clk) signal 402, a data input signal (sdata_in) 404, a data output signal (sdata_out) 406 and a BIST enable signal (bist_en) 408. In accordance with one embodiment of the invention, the shift register may be active whenever the bist_en signal 408 is low. Accordingly, data may be shifted in and out of the shift register 206 whenever the bist_en signal 408 is low. Whenever the bist_en signal 408 is high, data shifting may be suspended and the BIST logic block 216 may become active. In this regard, whenever the bist_en signal 408 is high, memory testing by the BIST module 202 may proceed. The BIST module 202 may be configured to operate at the same frequency as the system clock (clk). Advantageously, this may permit the BIST to test a memory under test at operational speeds. In one aspect of the invention, the system clock (clk) and data clock (data_clk) signals may be adapted to be independent signals and in this regard, the system clock (clk) and data clock (data_clk) signals may not require synchronization.

Generally, in operation, the BIST module 202 may be controlled by a test software application that may be configured to run, for example on a host system such as a PC. Under control of the test software application, data may be shifted into the shift register 206 with the sdata_in signal and shifted out of the shift register 206 with the sdata_out signal. The speed at which data may be shifted in and shifted out of the shift register 206 may be controlled by the test application software application, through for example, the data_clk signal. The data shifted out of the shift register may contain results of any testing done on a DUT by the BIST module 202.

In one aspect of the invention, the host application software may be adapted so that the bist_en signal may be an active low signal. However, the invention is not limited in this regard. In this case, while the bist_en remains at a logic zero (0) or low, data may be shifted into the shift register 206 via the sdata_in signal. Upon completion of shifting data into the shift register 206, the bist_en signal may be changed to a logic one (1) or high. When this happens, the BIST logic block 216 may subsequently be activated and testing may begin.

In another aspect of the invention, whenever the done signal is a logic one (1) or high, the bist_en signal may be transitioned to a logic zero (0) or low in order to initiate the completion a full test cycle. Upon completion of the actual testing, data which may include test results stored during testing, may be shifted out of the shift register 206 at a rate of data_clk. The data may include information such as an address of a memory location where and error occurred, the expected data (expected_data), the RAM data (rdata_o), the location of the failing columns (col_fail), whether the test was a success or a failure (pass/fail) and information such as fuse repair information. Simultaneously, the host software application may shift new data into the shift register 206 in order to initiate a subsequent test cycle. A done signal generated by the BIST logic block 216 may be set to a logic one (1) or high to represent the completion of testing of a DUT such as a memory module. The first synchronizer 212 may receive the done signal and synchronize the done signal with the data clock signal (data_clk) to generate a done_sync signal. The done_sync signal may be utilized to initiate or signify the beginning of testing of a subsequent memory module or signify the end of testing of a memory as appropriate.

The BIST module 202 may be adapted to include at least two modes of operation, namely, a normal mode and a stop-on-error mode. In accordance with one aspect of the invention, in the stop-on-error mode, the BIST module 202 may be adapted to stop testing on the occurrence of a first error, or a predefined amount of errors. In the stop-on-error mode, whenever the BIST module 202 may be configured to report error data belonging to at least a first memory location of memory module 202 where an error occurred. In this regard, the stop-on-error mode may be notably suitable for a debugging operation rather than a pass/fail analysis. The stop-on-error mode may be controlled by the stop_on_error signal (FIG. 2).

In the normal mode of operation, the BIST module 202 may be adapted to continue testing the at least a portion of the memory module despite the occurrence of one or more errors or failures. An output signal, for example a pass/fail signal, from the comparator 220 may be configured to set a bit in the internal register 218, which may subsequently be read by the host application software. In one embodiment of the invention, the pass fail bit in the internal register 218 may be set to a logic one (1) or high to indicate that the memory module under test is un-repairable.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

Accordingly, the present invention may be realized in hardware, software, or a combination of hardware and software. The present invention may be realized in a centralized fashion in one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention also may be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

Notwithstanding, the invention and its inventive arrangements disclosed herein may be embodied in other forms without departing from the spirit or essential attributes thereof. Accordingly, reference should be made to the following claims, rather than to the foregoing specification, as indicating the scope of the invention. In this regard, the description above is intended by way of example only and is not intended to limit the present invention in any way, except as set forth in the following claims.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for testing and debugging an embedded device under test, the method comprising:
   loading an instruction into a parameterized shift register of each of a plurality of BIST modules, each of said plurality of BIST modules coupled to respective an individual one of a plurality of embedded memory modules comprising the embedded device under test;
   determining an identity of each of said instruction loaded into said parameterized shift register of each of said plurality of BIST modules;
   generating a separate test signal from each of said plurality of BIST modules corresponding to said determined identity of said instruction loaded in said each of said plurality of BIST modules, said each one of said generated test signals causing control and execution of the testing and debugging of a corresponding one of each of said plurality of embedded memory modules comprising the embedded device under test; and
   loading test results from said each one of said plurality of embedded memory modules into said parameterized shift register of said each of said plurality of BIST modules coupled to said individual one of said plurality of embedded memory modules.

2. The method according to claim 1, wherein said loading comprises generating at least one clock signal from a host application software, said at least one clock signal controlling said loading of said instruction into said parameterized shift register of said each of said plurality of BIST modules.

3. The method according to claim 2, wherein said loading comprises shifting said instruction into said parameterized shift register of said each of said plurality of BIST modules.

4. The method according to claim 3, comprising identifying a command within said instruction shifted into said each one of said parameterized shift register of said each of said plurality of BIST modules.

5. The method according to claim 4, wherein said identifying comprises decoding said identified command for said each of said plurality of BIST modules.

6. The method according to claim 1, comprising shifting said loaded test results out of each one of said parameterized shift register under control of a host application software, said host application software adapted to control said each of said plurality of BIST modules coupled to an individual one of said plurality of embedded memory modules.

7. The method according to claim 1, comprising storing at least a portion of said test results for each one of said memory modules in a corresponding internal register of said each of said plurality of BIST modules, said internal register accessible by said host application software.

8. The method according to claim 1, wherein said identity of each of said instruction loaded into said parameterized shift register of said each of said plurality of BIST modules are different.

9. The method according to claim 1, wherein said identity of each of said instruction loaded into said parameterized shift register of said each of said plurality of BIST modules are similar.

10. The method according to claim 1, wherein said generating of said separate test signal from said each one of said BIST modules corresponding to said determined identity of said instruction loaded in said each one of said BIST modules, causes parallel execution of the testing and debugging of a said plurality of embedded memory modules comprising the embedded device under test.

11. The method according to claim 1, wherein said generating of said separate test signal from said each of said plurality of BIST modules corresponding to said determined identity of said instruction loaded in said each of said plurality of BIST modules, causes serial execution of the testing and debugging of each one of said plurality of embedded memory modules comprising the embedded device under test.

12. A system for testing and debugging an embedded device under test, the system comprising:
   at least one loader adapted to load an instruction into a parameterized shift register of each of a plurality of BIST modules, said each of said plurality of BIST modules coupled to an individual one of a plurality of embedded memory modules comprising the embedded device under test;
   at least one identifier adapted to determine an identity of each of said instruction loaded into said parameterized shift register of said each of said plurality of BIST modules; and
   at least one generator adapted to generate a separate test signal from said each of said plurality of BIST modules corresponding to said determined identity of said instruction loaded in said each of said plurality of BIST modules, said each one of said generated test signals causing control and execution of the testing and debugging of a corresponding one of each of said plurality of embedded memory modules comprising the embedded device under test, wherein said at least one loader is adapted to load test results from said each one of said plurality of embedded memory modules into said parameterized shift register of said each of said plurality of BIST modules coupled to said individual one of said plurality of embedded memory modules.

13. The system according to claim 12, wherein said at least one loader is adapted to generate at least one clock signal from a host application software, said at least one clock signal controlling said loading of said instruction into said parameterized shift register of said each of said plurality of BIST modules.

14. The system according to claim 13, wherein said at least one loader comprises at least one shifter adapted to shift said instruction into said parameterized shift register of said each of said plurality of BIST modules.

15. The system according to claim 14, wherein said least one identifier is adapted to identify a command within said instruction shifted into said each one of said parameterized shift register of said each of said plurality of BIST modules.

16. The system according to claim 15, wherein said least one identifier comprises at least one decoder adapted to decode said identified command for said each of said plurality of BIST modules.

17. The system according to claim 12, wherein said at least one shifter is adapted to shift said loaded test results out of each one of said parameterized shift register under control of a host application software, said host application software adapted to control said each of said plurality of BIST modules coupled to an individual one of said plurality of embedded memory modules.

18. The system according to claim 12, comprising at least one internal register for storing at least a portion of said test results for each one of said memory modules within said each of said plurality of BIST modules, said internal register accessible by said host application software.

19. The system according to claim 12, wherein said identity of each of said instruction loaded into said parameterized shift register of said each of said plurality of BIST modules are different.

20. The system according to claim 12, wherein said identity of each of said instruction loaded into said parameterized shift register of said each of said plurality of BIST modules are similar.

21. The system according to claim 12, wherein said at least one generator adapted to generate said separate test signal from said each one of said BIST modules corresponding to said determined identity of said instruction loaded in said each of said plurality of BIST modules, causes parallel execution of the testing and debugging of a said plurality of embedded memory modules comprising the embedded device under test.

22. The system according to claim 12, wherein said at least one generator adapted to generate said separate test signal from said each of said plurality of BIST modules corresponding to said determined identity of said instruction loaded in said each of said plurality of BIST modules, causes serial execution of the testing and debugging of each one of said plurality of embedded memory modules comprising the embedded device under test.

23. A machine-readable storage, having stored thereon a computer program having at least one code section for testing and debugging an embedded device under test, the code sections executable by a machine for causing the machine to perform the steps comprising:

loading an instruction into a parameterized shift register of each one of a plurality of BIST modules coupled to an individual one of a plurality of embedded memory modules comprising the embedded device under test;

determining an identity of each of said instruction loaded into said parameterized shift register of said each of said plurality of BIST modules;

generating a separate test signal from said each of said plurality of BIST modules corresponding to said determined identity of said instruction loaded in s said each of said plurality of BIST modules, said each one of said generated test signals causing control and execution of the testing and debugging of a corresponding one of each of said plurality of embedded memory modules comprising the embedded device under test; test; and loading test results from said each one of said plurality of embedded memory modules into said parameterized shift register of said each of said plurality of BIST modules coupled to said individual one of said plurality of embedded memory modules.

24. The machine-readable storage according to claim 23, wherein said loading code section comprises at least one code section for generating at least one clock signal from a host application software, said at least one clock signal controlling said loading of said instruction into said parameterized shift register of said each of said plurality of BIST modules.

25. The machine-readable storage according to claim 24, wherein said loading code section comprises at least one code section for shifting said instruction into said parameterized shift register of said each of said plurality of BIST modules.

26. The machine-readable storage according to claim 25, comprising at least one code section for identifying a command within said instruction shifted into said each one of said parameterized shift register of said each of said plurality of BIST modules.

27. The machine-readable storage according to claim 26, wherein said at least one identifying code section comprises code section for decoding said identified command for said each of said plurality of BIST modules.

28. The machine-readable storage according to claim 23, comprising at least one code section for shifting said loaded test results out of each one of said parameterized shift register under control of a host application software, said host application software adapted to control said each of said plurality of BIST modules coupled to an individual one of said plurality of embedded memory modules.

29. The machine-readable storage according to claim 23, comprising at least one code section for storing at least a portion of said test results for each one of said memory modules in a corresponding internal register of said each of said plurality of BIST modules, said internal register accessible by said host application software.

30. The machine-readable storage according to claim 23, wherein said identity of each of said instruction loaded into said parameterized shift register of said each of said plurality of BIST modules are different.

31. The machine-readable storage according to claim 23, wherein said identity of each of said instruction loaded into said parameterized shift register of said each of said plurality of BIST modules are similar.

32. The machine-readable storage according to claim 23, wherein said at least one code section for generating said separate test signal from said each of said plurality of BIST modules corresponding to said determined identity of said instruction loaded in said each of said plurality of BIST modules, causes parallel execution of the testing and debugging of a said plurality of embedded memory modules comprising the embedded device under test.

33. The machine-readable storage according to claim 23, wherein said at least one code section for generating said separate test signal from said each of said plurality of BIST modules corresponding to said determined identity of said instruction loaded in said each of said plurality of BIST modules, causes serial execution of the testing and debugging of each one of said plurality of embedded memory modules comprising the embedded device under test.

* * * * *